United States Patent [19]

Kushi et al.

[11] Patent Number: 4,985,343
[45] Date of Patent: Jan. 15, 1991

[54] CROSSLINKING-CURABLE RESIN COMPOSITION

[75] Inventors: Kenji Kushi; Ken-ichi Inukai; Takayuki Iseki; Yasuyuki Fujimoto, all of Otake, Japan

[73] Assignee: Mitsubishi Rayon Co., Ltd., Tokyo, Japan

[21] Appl. No.: 473,449

[22] Filed: Feb. 1, 1990

[30] Foreign Application Priority Data

Feb. 9, 1989 [JP] Japan ................. 1-28662
Oct. 9, 1989 [JP] Japan ................. 1-263511
Oct. 11, 1989 [JP] Japan ................. 1-264598

[51] Int. Cl.$^5$ .................................. G03C 1/725
[52] U.S. Cl. ......................... 430/285; 430/260; 430/271; 430/275; 430/281; 430/288; 522/121
[58] Field of Search ............... 430/281, 288, 271, 275, 430/260, 285; 522/121, 313

[56] References Cited

U.S. PATENT DOCUMENTS

| | | | |
|---|---|---|---|
| 4,245,031 | 1/1981 | Chambers | 430/288 |
| 4,288,257 | 9/1931 | Morgan | 430/288 |
| 4,435,671 | 1/1985 | Geissler et al. | 430/288 |
| 4,458,006 | 7/1984 | Doenges et al. | 430/288 |
| 4,562,142 | 12/1985 | Kafumar et al. | 430/288 |

Primary Examiner—Jack P. Brammer
Attorney, Agent, or Firm—Oblon, Spivak, McClelland, Maier & Neustadt

[57] ABSTRACT

A crosslinking-curable resin composition suitable for use in dry film resists, consisting essentially of
(a) 40 to 70 parts by weight of a thermoplastic polymer binder obtained by copolymerizing four specific polymerizable substances in specific proportions;
(b) 20 to 50 parts by weight of a crosslinkable monomer having one or more ethylenically unsaturated groups in the molecule and containing 51 to 100% by weight of a compound of the general formula

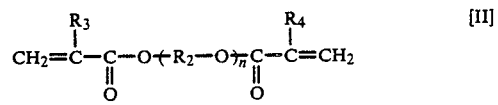

where $R_2$ is an alkylene group of 3 to 6 carbon atoms, $R_3$ and $R_4$ are hydrogen or methyl, and n is a positive whole number of 5 to 9; and
(c) 0 to 10 parts by weight of a photopolymerization initiator;

the combined amount of components (a) to (c) being 100 parts by weight.

10 Claims, No Drawings

CROSSLINKING-CURABLE RESIN COMPOSITION

BACKGROUND OF THE INVENTION

1. Field of the Invention

This invention relates to photopolymerizable or radiation-polymerizable resin compositions which can be developed with an aqueous alkaline solution.

2. Description of the Prior Art

In recent years, so-called dry film resists comprising a layer of photopolymerizable resin sandwiched between a supporting film and a protective film are being widely used as photoresists for the fabrication of printed wiring boards. According to the nature of the photopolymerizable resin, there are two types of dry film resists. One of them is the solvent-developing type in which unexposed areas are removed by means of a chlorine-containing organic solvent, and the other is the alkali-developing type in which unexposed areas are removed by means of an aqueous alkaline solution. However, the recent trend is towards the use of alkali-developing type dry film resists because of their little influence on the environment and their low manufacturing cost.

Typically, an alkali-developing type dry film resist having a supporting film and a protective film is used in the following manner: While the protective film is being separated from the dry film resist, its photopolymerizable resin surface is heat-laminated to a copper-clad laminate. Then, a photo tool is brought into contact with the supporting film surface and the dry film resist is exposed to ultraviolet radiation or the like so that desired areas thereof may be cured. After the supporting film is separated, the resist is developed with an aqueous solution of a weak alkali such as sodium carbonate to remove the unexposed areas and thereby form a circuit pattern of resist. In the copper through-hole process, the copper surface is then subjected to etching. Thereafter, the cured resist is stripped with an aqueous solution of a strong alkali such as sodium hydroxide to obtain a printed wiring board. In the solder through-hole process, the resist-coated laminate is subjected to copper plating and solder plating. Thereafter, the cured resist is stripped with an aqueous solution of a strong alkali and the exposed copper is etched away to obtain a printed wiring board.

It is a matter of course that, when used in the above-described processes, dry film resists have a sufficient degree of resistance for use as etching resists or plating resists. Up to this time, various investigations have been made for the main purpose of improving such resistance.

However, many of the conventional alkali-developing type dry film resists have had the disadvantage that the time required to strip the cured resist with an aqueous solution of a strong alkali (i.e., stripping time) is long. Such a long stripping time causes the copper surface of the substrate to be oxidized and discolored by the action of the alkali, thus exerting an adverse influence on subsequent steps such as etching. Moreover, in the solder through-holes process, solder is dissolved in the aqueous solution of strong alkali, so that the thinning or breaking of patterns may occur and/or fusing may become impossible.

On the other hand, most of the conventional alkali-developing type dry film resist having a short stripping time have had the disadvantage that the stripped pieces obtained by treating the cured resist with a strongly alkaline stripping solution are easily dissolvable in the stripping solution. Where the stripped pieces of the cured resist are easily dissolvable in the stripping solution, they easily swell to form a gel while staying in the stripping tank, and the resulting gel frequently clog the meshes of the filter provided in the stripping machine for the purpose of capturing stripped pieces. As a result, the flow rate of the circulating stripping solution is reduced, so that it may become impossible to strip the cured resist and/or the stripping solution may flow over the edge of the stripping tank to contaminate the surroundings thereof.

Moreover, most of the conventional alkali-developing type dry film resists having a short stripping time have had the disadvantage that the size of the stripped pieces obtained by treating the cured resist with a strongly alkaline stripping solution is too large or too small. If the stripped pieces are too large (i.e., larger than 45 mm × 45 mm), they tend to cling to the carrying rollers of the automatic stripping machine and may develop machine trouble. In Japanese Patent Laid-oipen No.10235/'89, therefore, an attempt has been made to reduce the size of stripped pieces by using a specific corsslinkable monomer. However, if stripped pieces are fine (i.e., smaller than 2 mm × 2 mm), they tend to pass through the meshes of the filter provided in the stripping machine for the purpose of capturing stripped pieces. As a result, such stripped pieces enter the circulating pump and the spray nozzle, thus interfering with the circulation of the stripping solution. Moreover, since such stripped pieces are not removed but stay in the stripping solution for a long period of time, the stripping solution deteriorates rapidly and/or the stripped pieces are dissolved therein, thus necessitating frequent replacement of the stripping solution.

Thus, conventional dry film resists have been unable to achieve a desirable combination of properties including a short stripping time, a proper stripped piece size, and the insolubility of stripped pieces in the stripping solution.

SUMMARY OF THE INVENTION

It is an object of the present invention to provide an alkali-developing type crosslinkable resin composition of photopolymerizable or radiation-polymerizable type which can overcome the above-described disadvantages by achieving a desirable combination of properties including a short stripping time, a proper stripped piece size, and the insolubility of stripped pieces in the stripping solution, as the result which can eliminate such troubles as discoloration of the copper surface by the alkali, dissolution of the solder in the alkaline solution, clinging of stripped pieces to the carrying rollers of the stripping machine, rapid deterioration of the stripping solution, and clogging of the filter of the stripping machine and which is capable of achieving high productivity and hence very useful for industrial purposes.

According to the present invention, there is provided a crosslinking-curable resin composition consisting essentially of (a) 40 to 70 parts by weight of a thermoplastic polymer binder obtained by copolymerizing
  (1) 15 to 35% by weight of a first polymerizable substance comprising one or more $\alpha,\beta$-unsaturated carboxyl-containing monomers having 3 to 15 carbon atoms, (2) 2 to 25% by weight of a second polymerizable substance comprising one or more compounds selected from the group consisting of compounds of the general formula

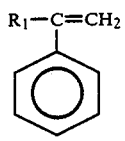

[I]

wherein $R_1$ is hydrogen, an alkyl group of 1 to 6 carbon atoms, or a halogen, and ring-substituted derivatives thereof, (3) 10 to 40% by weight of a third polymerizable substance comprising one or more compounds selected from the group consisting of alkyl acrylates having an alkyl group of 1 to 8 carbon atoms, and hydroxyalkyl acrylates having a hydroxyalkyl group of 2 to 8 carbon atoms, and (4) 30 to 65% by weight of a fourth polymerizable substance comprising one or more compounds selected from the group consisting of alkyl methacrylates having an alkyl group of 1 to 8 carbon atoms, and hydroxyalkyl methacrylates having a hydroxyalkyl group of 2 to 8 carbon atoms;

(b) 25 to 50 parts by weight of a crosslinkable monomer having one or more ethylenically unsaturated groups in the molecule and containing 51 to 100% by weight of a compound of the general formula

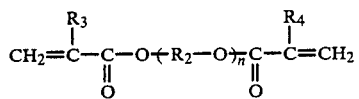

[II]

wherein $R_2$ is an alkylene group of 3 to 6 carbon atoms, $R_3$ and $R_4$ are hydrogen or methyl, and n is a positive whole number of 5 to 9; and (c) 0 to 10 parts by weight of a photopolymerization initiator;

the combined amount of components (a) to (c) being 100 parts by weight.

DESCRIPTION OF THE PREFERRED EMBODIMENTS

In the thermoplastic polymer binder constituting the crosslinkable resin compositions of the present invention, a first polymerizable substance comprising one or more $\alpha\beta$-unsaturated carboxyl-containing monomers having 3 to 15 carbon atoms must be copolymerized in an amount of 15 to 35% by weight, so as to make the compositions developable with a dilute aqueous solution of an alkaline material such as sodium carbonate. Useful examples of such carboxylic acid type monomers include acrylic acid, methacrylic acid, cinnamic acid, crotonic acid, sorbic acid, itaconic acid, propiolic acid, maleic acid and fumaric acid. In addition, half esters and anhydrides thereof can also be used. Among these compounds, acrylic acid and methacrylic acid are most preferred. This carboxylic acid type constituent should be used in such an amount that its content in the copolymer is in the range of 15 to 35% by weight, preferably 18 to 30% by weight. If the content of the carboxylic acid type constituent in the copolymer is less than 15% by weight, the resulting dry film resist cannot be developed with an aqueous alkaline solution or may require an excessively long developing time which would cause a reduction in resolution. On the other hand, if the content of the carboxylic acid type constituent in the copolymer is greater than 35% by weight, even photo-cured areas to be left as patterns will be liable to be swelled and be removed by an aqueous alkaline solution, so that it is difficult to control the development so as to obtain high-resolution patterns. Moreover, the cured areas will show a reduction in water resistance.

A second polymerizable substance copolymerized in the thermoplastic polymer binder is a compound of the general formula

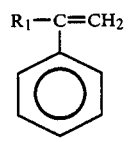

[I]

where $R_1$ is hydrogen, an alkyl group of 1 to 6 carbon atoms, or a halogen. The benzene ring of this compound may be substituted by functional groups such as nitro, alkoxy, acyl, carboxyl, sulfone and hydroxyl groups and halogen radicals, and the number of substituent groups present on the benzene ring may be in the range of 1 to 5. Preferred substituent groups are single alkyl groups such as methyl and tert-butyl groups. Among such compounds, styrene is most preferred. This second polymerizable substance should be used in such an amount that its content in the thermoplastic polymer binder is in the range of 2 to 25% by weight, preferably 3 to 20% by weight. If the content of this constituent is less than 2% by weight, it will be impossible to obtain a resist material having excellent chemical resistance and, in particular, excellent plating resistance. On the other hand, if the content of this constituent is greater than 25% by weight, the resist resin layer of the resulting dry film resist will be so hard that the resist will tend to peel off from the substrate and, moreover, the times required to develop and strip the resist by an aqueous alkaline solution will be prolonged.

A third polymerizable substance copolymerized in the thermoplastic polymer binder comprises at least one compound selected from the group consisting of alkyl acrylates having an alkyl group of 1 to 8 carbon atoms, and hydroxyalkyl acrylates having a hydroxyalkyl group of 2 to 8 carbon atoms. Examples of these compounds include methyl acrylate, ethyl acrylate, n-propyl acrylate, isopropyl acrylate, n-butyl acrylate, sec-butyl acrylate, tert-butyl acrylate, 2-hydroxyethyl acrylate, 2-hydroxypropyl acrylate and 2-ethylhexyl acrylate. Among these compounds, methyl acrylate, ethyl acrylate, n-butyl acrylate and 2-ethylhexyl acrylate are most preferred. In order to impart a moderate degree of flexibility to the photopolymerizable or radiation-polymerizable resin compositions of the present invention, this acrylate type constituent should be used in such an amount that its content in the thermoplastic polymer binder is in the range of 10 to 40% by weight, preferably 15 to 35% by weight. If the content of the acrylate type constituent is less than 10% by weight, the resulting dry film resist will fail to have a sufficient degree of flexibility. Thus, the dry film resist will have poor adhesion to the substrate and the resist resin will fail to fill up irregularities of the substrate surface, causing a reduction in plating resistance of the resist. On the other hand, if the content of the acrylate type constituent is greater than 40% by weight, the resulting resist resin will be so soft that, when it is formed into a dry film resist and stored in the form of a roll, it may suffer from the so-called cold flow phenomenon in which the resist resin flows from between the supporting films with the lapse of time.

A fourth polymerizable substance copolymerized in the thermoplastic polymer binder is used in combination with the alkyl acrylate and/or hydroxyalkyl acrylate to impart an appropriate glass transition temperature (Tg) to the thermoplastic polymer binder, and comprises at least one compound selected from the group consisting of alkyl methacrylates having an alkyl group of 1 to 8 carbon atoms, and hydroxyalkyl methacrylates having a hydroxyalkyl group of 2 to 8 carbon atoms. Examples of these compounds include methyl methacrylate, ethyl methacrylate, n-propyl methacrylate, isopropyl methacrylate, n-butyl methacrylate, sec-butyl methacrylate, tert-butyl methacrylate, 2-hydroxyethyl methacrylate, 2-hdyroxypropyl methacrylate and 2-ethylhexyl methacrylate. Among these compounds, methyl methacrylate is most preferred. This methacrylate type constituent should be used in such an amount that its content in the thermoplastic polymer binder is in the range of 30 to 65% by weight, preferably 35 to 60% by weight.

In order to accomplish the objects of the present invention, the thermopalstic polymer binder should be a polymer composed of the above-described specific monomers, and preferably has a weight average molecular weight of 40,000 to 500,000. If the weight average molecular weight is less than 40,000, the resulting dry film resist may suffer from the cold flow phenomenon. On the other hand, if the weight average molecular weight is greater than 500,000, unexposed portions of the resulting dry film will have insufficient solubility in alkaline developers and hence poor developability. Thus, an unduly long developing time will be required to cause a reduction in resolution and in productivity of circuit patterns.

In the crosslinkable resin compositions of the present invention, the thermoplastic polymer binder is used in an amount of 40 to 70 parts by weight, preferably 45 to 65 parts by weright, per 100 parts by weight of the crosslinkable resin composition. If the content of the thermoplastic polymer binder is less than 40 parts by weight, the film-forming properties of the photosensitive layer of the resulting dry film resist will be impaired. Thus, the dry film resist will fail to have sufficient film strength and may suffer from cold flow. On the other hand, if the content of the thermopalstic polymer binder is greater than 70 parts by weight, the resulting photo-cured film will be brittle, have poor adhesion to the substrate, and fail to exhibit sufficient chemical resistance and, in particular, sufficient plating resistance and etching resistance.

It is essential that the crosslinkable monomer constituting the compositions of the present invention, which comprises one or more compounds having one or more ethylenically unsaturated groups in the molecule, contain 51 to 100% by weight, preferably 55 to 90% by weight, of a compound of the general formula

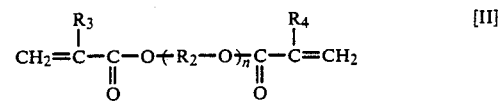

where $R_2$ is an alkylene group of 3 to 6 carbon atoms, $R_3$ and $R_4$ are hydrogen or methyl, and n is a positive whole number of 5 to 9. If the content of this compound in the crosslinkable monomer is less than 51% by weight, the resulting dry film resist will be unsatisfactory in that the time required to strip the cured resist with an aqueous alkaline solution is prolonged, and the stripped pieces will be very easily dissolved in the stripping solution, and it is difficult to control the stripped pieces to a proper size.

In the general formula [II], $R_2$ is an alkylene group of 3 to 6 carbon atoms. If a crosslinkable resin composition is prepared with a compound (such as polyethylene glycol) in which $R_2$ has 2 or less carbon atoms, the crosslinking density of its cured product will be so high that the stripping time is prolonged. Moreover, since this crosslinkable monomer has a high degree of hydrophilicity, the stripped pieces of the cured resist will be unduly fine and easily dissolvable in the stripping solution. On the other hand, if a crosslinkable resin composition is prepared with a compound in which $R_2$ has 7 or more carbon atoms, the composition will have insufficient curability and show a reduction in chemical resistance, particularly in plating resistance and etching resistance.

In the general formula [II], n is a positive whole number of 5 to 9. If a crosslinkable resin composition is prepared with a compound in which n is 4 or less, the crosslinking density of its cured product will be so high that the stripping time is prolonged. Moreover, the stripped pieces of the cured resist will be unduly fine and tend to pass through the meshes of the filter of the stripping machine. On the other hand, if a crosslinkable resin composition is prepared with a compound in which n is 10 or greater, the composition will have insufficient curability and show a reduction in chemical resistance, particularly in plating resistance and etching resistance. Moreover, the stripped pieces will be unduly large and tend to cling to the carrying rollers of the stripping machine.

Accordingly, in order to obtain crosslinkable resin compositions which can achieve the desired combination of properties including good chemical resistance, excellent strippability, insolubility of stripped pieces, and a proper stripped piece size, $R_2$ in the general formula [II] should be an alkylene group of 3 to 6 carbon atoms and n should be in the range of 5 to 9.

The compounds represented by the general formula [II] include, for example, hexa-1,3-propanediol di(meth)acrylate ("hexa" means that n=6 in the general formula [II], "1,3-propanediol" means that $R_2 = -CH_2CH_2CH_2-$, and "(meth)acrylate" means that $R_3$, $R_4 =$ H or $CH_3$; the same will apply hereinafter), octa-1,3-propanediol di(meth)acrylate, hexapropylene glycol di(meth)acrylate, octapropylene glycol di(meth)acrylate, nona-1,2-butanediol di(meth)acrylate, hexa-1,3-butanediol di(meth)acrylate, octa-1,3-butanediol di(meth)acrylate, penta-1,4-butanediol di(meth)acrylate, nona-2,3-butanediol di(meth)acrylate, penta-2-methyl-1,3-propanediol di(meth)acrylate, hepta-2-methyl-1,3-propanediol di(meth)acrylate, nona-2- methyl-1,3-propanediol di(meth)acrylate, hepta-1,1-dimethyl-1,2-ethanediol di(meth)acrylate, octa-1,2-pentanediol di(meth)acrylate, nona-1,3-pentanediol di(meth)acrylate, hexa-1,4-pentanediol di(meth)acrylate, hepta-1,5-pentanediol di(meth)acrylate, octa-2,3-pentanediol di(meth)acrylate, hepta-2,4-pentanediol di(meth)acrylate, hexa-2,2-dimethyl-1,3-propanediol di(meth)acrylate, octa-2,2-dimethyl-1,3-propanediol di(meth)acrylate, octa-1,2-hexanediol di(meth)acrylate, hexa-1,3-hexanediol di(meth)acrylate, hepta-1,4-hexanediol di(meth)acrylate, penta-1,5-hexanediol di(meth)acrylate, hepta-1,6-hexanediol di(meth)acrylate, octa-2,3-hexanediol di(meth)acrylate, nona-2,4-hexanediol di(meth)acrylate, hepta-2,5-hexanediol di(meth)acrylate and hexa-3,4-hexanediol di(meth)acrylate. Among others, compounds of formula [II] in which $R_2$ has 3 carbon atoms are preferred. These compounds are represented by the general formula

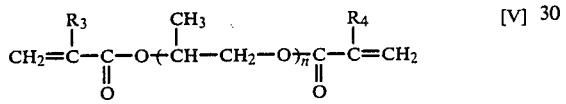

where $R_3$ and $R_4$ are hydrogen or methyl, and n is a positive whole number of 5 to 9, and include pentapropylene glycol di(meth)acrylate, hexapropylene glycol di(meth)acrylate, heptapropylene glycol di(meth)acrylate, octapropylene glycol di(meth)acrylate and nonapropylene glycol di(meth)acrylate. Commercial products thereof include, for example, NK-Ester 9PG and NK-Ester APG-400 (both manufactured by Shin-Nakamura Chemical Co., Ltd.). More preferred is heptapropylene glycol di(meth)acrylate that is the compound of formula [V] in which n=7. Commercial products thereof include, for example, NK-Ester APG-400 (manufactured by Shin-Nakamura Chemical Co., Ltd.). These compounds may be used alone or in admixture of two or more.

It is preferable that the crosslinkable monomer constituting the compositions of the present invention, which comprises one or more compounds having one or more ethylenically unsaturated groups, additionally contain 5 to 49% by weight of at least one compound selected from the group consisting of compounds of the general formula

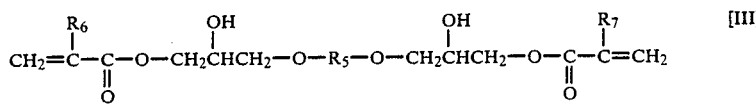

where $R_5$ is an orgnic radical having 2 to 33 carbon atoms, and $R_6$ and $R_7$ are hydrogen or methyl, and compounds of the general formula

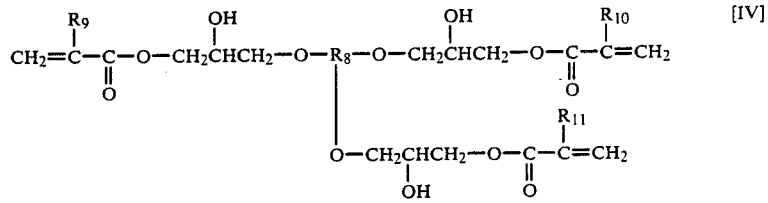

where $R_8$ is an organic radical having 3 to 15 carbon atoms, and $R_9$, $R_{10}$ and $R_{11}$ are hydrogen or methyl. These compounds are highly hydrophilic because of the presence of two or more hydroxyl groups in the molecule, and hence very effective in reducing the time required to strip the cured film with an aqueous alkaline solution. Moreover, these compounds make it possible to form dry film resists having good adhesion to the copper substrate and showing an improvement in etching resistance and plating resistance.

In the crosslinkable monomer constituting the compositions of the present invention and having one or more ethylenically unsaturated groups in the molecule, the compound of formula [III] or [IV] is preferably used in an amount of 5 to 49% by weight and more preferably 7 to 45% by weight. If the content of the compound in the crosslinkable monomer is less 5% by weight, the resulting dry film resist will be unable to accomplish the objects of the present invention because the time required for stripping with an aqueous alkaline solution will be prolonged and its adhesion to the substrate will be impaired. On the other hand, if the content of the compound is greater than 49% by weight, the stripped pieces will be easily dissolvable in the stripping solution.

The compounds represented by the general formula [III] include bifunctional epoxy (meth)acrylates such as ethylene glycol diglycidyl ether di(meth)acrylate, diethylene glycol diglycidyl ether di(meth)acrylate, nonaethylene glycol diglycidyl ether di(meth)acrylate, propylene glycol diglycidyl ether di(meth)acrylate, tripropylene glycol diglycidyl ether di(meth)acrylate, undecapropylene glycol diglycidyl ether di(meth)acrylate, 1,3-propanediol diglycidyl ether di(meth)acrylate, neopentyl glycol diglycidyl ether di(meth)acrylate, 1,6-hexanediol diglycidyl ether di(meth)acrylate, diglycidyl adipate di(meth)acrylate, diglycidyl phthalate di(meth)acrylate, diglycidyl hexahydrophthalate di(meth)acrylate, resorcinol diglycidyl ether di(meth)acrylate and bisphenol A diglycidyl ether di(meth)acrylate. Among others, preferred compounds are those represented by the general formula

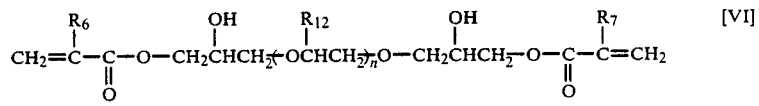

where $R_6$, $R_7$ and $R_{12}$ are hydrogen or methyl and may be the same or different, and n is a positive whole number of 1 to 11. More preferred are ethylene glycol diglycidyl ether di(meth)acrylate, diethylene glycol diglycidyl ether di(meth)acrylate, triethylene glycol diglycidyl ether di(meth)acrylate, propylene glycol diglycidyl ether di(meth)acrylate, dipropylene glycol diglycidyl ether di(meth)acrylate and tripropylene glycol diglycidyl ether di(meth)acrylate. Commercial products thereof include, for example, Denacol Acrylate DM-811, Denacol Acrylate DM-851, Denacol Acrylate DA-911 and Denacol Acrylate DA-920 (all manufactured by Nagase Chemical Industry Co., Ltd.).

The compounds represented by the general formula [IV] include trifunctional epoxy (meth)acrylates such as glycerol triglycidyl ether tri(meth)acrylate, trimethylolethane triglycidyl ether tri(meth)acrylate, trimethylolpropane triglycidyl ether tri(meth)acrylate and phloroglucinol triglycidyl ether tri(meth)acrylate. Among others, glycerol triglycidyl ether tri(meth)acrylate, trimethylolethane triglycidyl ether tri(meth)acrylate and trimethylolpropane triglycidyl ether tri(meth)acrylate are preferred. Commercial products thereof include, for example, Denacol Acrylate DA-314 (manufactured by Nagase Chemical Industry Co., Ltd.).

These compounds of formulas [III] and [IV] may be used alone or in admixture of two or more.

In addition to the crosslinkable monomers represented by the general formulas [II], [III] and [IV], any compounds having one or more ethyleneically unsaturated groups in the molecule may be used as crosslinkable monomers. Examples thereof include (meth)acrylates of polyhydric alcohols such as phenoxydiethoxy (meth)acrylate, polyethylene glycol di(meth)acrylate, 1,3-butanediol di(meth)acrylate, 1,6-hexanediol di(meth)acrylate, neopentyl glycol di(meth)acrylate, 2,2-bis[4-(meth)acryloyloxypolyethoxyphenyl]propane, 2,2-bis[4-(meth)acryloyloxypolypropylenoxyphenyl]propane, neopentyl glycol hydroxypivalate di(meth)acrylate, glycerol di(meth)acrylate, glycerol tri(meth)acrylate, trimethylolethane di(meth)acrylate, trimethylolethane tri(meth)acrylate, trimethylolpropane di(meth)acrylate, trimethylolpropane tri(meth)acrylate, trimethylolpropane tris[polyethoxy(meth)acrylate], trimethylolpropane tris[polypropylenoxy(meth)acrylate], triethylol isocyanurate di(meth)acrylate, triethylol isocyanurate tri(meth)acrylate, pentaerythritol di(meth)acrylate, pentaerythritol tri(meth)acrylate, pentaerythritol tetra(meth)acrylate, dipentaerythritol tri(meth)acrylate, dipentaerythritol tetra(meth)acrylate, dipentaerythritol penta(meth)acrylate, dipentaerythritol hexa(meth)acrylate, compounds of formula [II] in which n is in the range of 1 to 4, and compounds of formula [II] in which n is 10 or more; acrylamide derivatives such as n-butoxymethylacrylamide and isobutoxymethylacrylamide; and urethane (meth)acrylates. These compounds may be used alone or in admixture, or need not be used, if undesired.

In order to impart the desired combination of properties (i.e., excellent strippability of the cured resist, a proper stripped piece size, and the insolubility of stripped pieces in aqueous alkaline solution) to the crosslinkable resin compositions of the present invention, it is essential to use 25 to 50 parts by weight of a crosslinkable monomer containing a specific proportion of a compound of formula [II], in combination with 40 to 70 parts by weight of the above-specified thermoplastic polymer binder. Compositions outside the scope of the present invention would be unable to form dry film resists having the desired combination of properties including excellent strippability, a proper stripped piece size, and insolubility of stripped pieces. As described above, the thermoplastic polymer binder used in the present invention makes it possible to develop and strip the resist with an aqueous alkaline solution, by using a specific amount of a carboxylic acid type monomer as a copolymer constituent. Moreover, it has been found that, by incorporating not less than a specific amount of a crosslinkable monomer of formula [II] in the aforesaid thermoplastic polymer binder, it becomes possible to obtain dry film regists having a desirable combination of properties (i.e., excellent strippability, a proper stripped piece size, and insolubility of stripped pieces) which cannot be predicted from the prior art. Although its exact mechanism has not been fully elucidated, it is presumed that the use of the crosslinkable monomer of formula [II] causes the crosslinkable resin composition to be cured to an appropriate degree, and the moderate hydrophilicity of the crosslinkable monomer of formula [II] increases the nonuniformity of swelling pressure produced during swelling of the cured resist by an aqueous alkaline solution, resulting in an improvement in strippability and the fragmentation of the cured resist to a proper size. Moreover, it is thought that, since the molecular structure of the crosslinkable monomer of formula [II] is moderately hydrophobic when viewed from the other side, the solubility of the cured resist in aqueous alkaline solutions is reduced and the stripped pieces thereof become insoluble therein.

The strippability of the crosslinkable resin compositions of the present invention can further be improved by incorporating therein a specific amount of a crosslinkable monomer of formula [III] or [IV]. The reason for this is considered to be that the penetration of the aqueous alkaline solution into the cured resist is promoted by the high hydrophilicity of the crosslinkable monomer of formula [III] or [IV].

In the crosslinkable resin compositions of the present invention, the crosslinkable monomer having one or more ethylenically unsaturated groups in the molecule is used in an amount of 25 to 50 parts by weight, preferably 30 to 45 part by weight, per 100 parts by weight of the crosslinkable resin composition. If the content of the crosslinkable monomer is less than 25 parts by weight, the resulting crosslinkable composition cannot be photo-cured to a full degree and will show a reduction in chemical resistance, particularly in plating resistance and etching resistance. On the other hand, if the content of the crosslinkable monomer is greater than 50 parts by weight, the resulting dry film resist will tend to suffer from cold flow and the cured product thereof will show a reduction in strippability with an aqueous alkaline solution.

The photopolymerization initiator used to photopolymerize the crosslinkable resin compositions of the present invention can be any of conventional photopolymerization initiators including, for example, benzophenone, Michler's ketone, 4,4'-bis(diethylamino)benzophenone, tert-butylanthraquinone, 2-ethylanthraquinone, thioxanthones, benzoin alkyl ethers and benzyl ketals. These polymerization initiators may be used alone or in combination.

Where it is desired to cure the crosslinkable resin compositions of the present invention by means of ultraviolet radiation, the photopolymerization initiator is used in an amount of 0.1 to 10 parts by weight per 100 parts by weight of the photopolyemrizable resin composition. If its amount is less than 0.1 part by weight, the resulting crosslinkable resin composition cannot be photo-cured to a full degree, and if its amount is greater than 10 parts by weight, the resulting crosslinkable resin composition will be thermally unstable. Where it is desired to cure the photopolymerizable resin compositions of the present invention by means of electron rays, the photopolymerization initiator need not be used.

In order to further improve their plating resistance, the crosslinkable resin compositions of the present invention may preferably contain tetrazole or a derivative thereof. The addition of a small amount of tetrazole or a derivative thereof can improve adhesion to metallic surfaces. Examples of tetrazole derivatives include 1-phenyltetrazole, 5-phenyltetrazole, 5-aminotetrazole, 5-amino-1-methyltetrazole, 5-amino-2-phenyltetrazole, 5-mercapto-1-phenyltetrazole and 5-mercapto-1-methyltetrazole. These tetrazole derivatives may be used alone or in combination. Compounds other than tetrazole and derivatives thereof, such as benzotriazole and benzimidazole, may not be effective in improving plating resistance, unless they are used in large amounts. However, when used in large amounts, such compounds not only reduce the sensitivity of the resulting crosslinkable resin composition, but also remain on the copper surface even after development or stripping, thus impairing the adhesion of the deposited metal and retarding subsequent etching. Tetrazole or a derivative thereof is preferably used in an amount of 0.005 to 5 parts by weight per 100 parts by weight of the combination of the thermoplastic polymer binder, the crosslinkable monomer and the photopolymerization initiator. If its amount is less than 0.005 part by weight, the resulting crosslinkable resin composition will not show a distinct improvement in plating resistance. On the other hand, if its amount is greater than 5 parts by weight, it takes a long time to dissolve the additive in the crosslinkable resin composition and, moreover, the resulting crosslinkable resin composition will show a reduction in sensitivity.

If necessary, the crosslinkable resin compositions of the present invention can further contain other additives such as thermal polymerization inhibitors, dyes, plasticizers and fillers.

The crosslinkable resin compositions of the present invention can be directly formed into films on desired substrates, without using any diluent. However, the formation of films is facilitated by mixing and dissolving them in one or more solvents having a relatively low boiling point. Useful solvents include, for example, acetone, methyl ethyl ketone, methyl cellosolve, ethyl cellosolve, dichloromethane, chloroform, methyl alcohol, ethyl alcohol and isopropyl alcohol. These solvents are used in an amount of not greater than 200 parts by weight, preferably 50 to 150 parts by weight, per 100 parts by weight of the crosslinkable resin composition.

In order to form a dry film resist using a crosslinkable resin composition prepared, the composition may be applied with any of various devices such as a blade coater, rod coater, knife coater, roll doctor coater, comma coater, reverse-roll coater, transfer roll coater, gravure coater, kiss-roll coater and a curtain coater. Where the composition contains a solvent, it is necessary to evaporate the solvent. The support on which a dry film resist is formed usually comprises a plastic film made of polyester or the like. For drying purposes, where a combustible organic solvent is used, it is important from the viewpoint of safety to employ a dryer equipped with a heat source in which air is heated with steam. The dryer may be of a type in which hot air is supplied countercurrently and brought into contact with the substrate, or of a type in which hot air is directly blown from nozzles onto the substrate. With respect to its shape, the dryer may be selected from among arch type, flat type and other dryers according to the intended purpose.

After drying, the dry film resist may be laminated with a protective film of polyethylene or polypropylene, if necessary.

Dry film resists formed in the above-described manner are very excellent in strippability, stripped piece size and stripped piece insolubility. When used as resists for etching and for metal plating, they exhibit excellent workability and in-process durability, thus making it possible to create high-resolution patterns.

SYNTHESIS EXAMPLE (Synthesis of Thermoplastic Resin Binders)

A 1000-ml four-necked flask fitted with a nitrogen inlet, stirrer, condenser and a thermometer was charged with 100 g of isopropyl alcohol, 100 g of methyl ethyl ketone, and 200 g of each of the polymerizable monomer mixtures having the respective compositions shown in Table 1, under an atmosphere of nitrogen. While the contents of the flask were stirred, the temperature of the water bath was raised to 80° C. Then, a solution of 1.0 g of azobisisobutyronitrile in 10 g of isopropyl alcohol was added and the resulting mixture was polymerized for 4 hours. Moreover, a solution of 1.0 g of azobisisobutyronitrile in 10 g of isopropyl alcohol was added thereto in five portions at intervals of 30 minutes. Thereafter, the internal temperature of the flask was raised to the boiling point of the solvent and the polymerization was continued for 2 hours at that temperature. After completion of the polymerization, 100 g of isopropyl alcohol was added and the polymerization product was taken out of the flask. Thus, there were obtained binder resin solutions A to F as shown in Table 1. For all monomer mixtures, the degree of conversion was 99.5% or higher. All binder resin solutions had a solid content of 38.7% by weight.

EXAMPLES 1-14 AND COMPARATIVE EXAMPLES 1-16

Using the binder resin solutions A to F obtained in the foregoing Synthesis Example, various crosslinkable resin compositions were prepared according to the formulations shown in Table 2.

Each of the prepared compositions was agitated with a propeller mixer and applied with a blade coater onto a polyester film, 25 $\mu$m thick and 360 mm wide, so as to give a coating width of 340 mm. Then, the coated polyester film was passed through a flat type dryer having a width of 400 mm, a height of 100 mm and a length of 8 m, in which hot air was supplied countercurrently to obtain a dry coating film thickness of 50 $\mu$m. The coating speed was 5 m per minute and the temperature of the hot air was 90° C. Then, the dry coating film was laminated with a protective film of polyethylene, 35 $\mu$m thick, to obtain a dry film resist. This dry film resist, which had a length of 120 m, was rolled up. The rolls thus obtained were laid on their side in a constant temperature room at 23° C. and allowed to stand for 5 days. Thereafter, they were visually examined for the occurrence of cold flow from their ends. The results of examination are shown in Tale 3.

While the protective film was being separated, each of the dry film resists was heat-laminated to copper-clad laminates so that the coating film was in contact with their copper surface. After the copper-clad laminates cooled to room temperature, a photo tool was brought into contact with the polyester film surface and the dry film resist was exposed to radiation from an ultrahigh pressure mercury vapor lamp. For this purpose, a USH-102D ultrahigh pressure mercury vapor lamp (manufactured by Ushio Inc.) was used and its intensity of irradiation was 100 mJ/cm$^2$. When measured with a UIT-100 ultraviolet photometer (manufactured by Ushio Inc.) equipped with a UVD-365P photo detector, the magnitude of the exposure energy was 5 mW/cm$^2$. After exposure, the resulting laminates were allowed to stand for 20 minutes, stripped of the supporting film, and then developed with a 1% aqueous solution of sodium carbonate. The development was performed at a solution temperature of 30° C. and a spray pressure of 1.4 kg/cm$^2$, using a spray nozzle held at a distance of 10 cm from the substrate. Thereafter, the laminates were degreased by immersing them in a neutral degreasing agent at room temperature for about one minute, washed with water spray in an overflow tank for about one minute, and then immersed in a 20% aqueous solution of ammonium persulfate for one minute. Subsequently, the laminates were washed again with water spray for one minute, immersed in 10% sulfuric acid for one minute, and further washed with water spray for one minute. Thereafter, the laminates were immersed in 10% sulfuric acid for one minute, placed in a copper sulfate plating solution, and copper-plated at 2.3 A/dm$^2$ for 75 minutes. During this plating, the solution temperature was 22° C. After completion of the plating, the laminates were immediately washed with water, immersed in a 15% aqueous solution of borofluoric acid for one minute, placed in a high throwing power tin-lead plating solution, and solder-plated at 1.8 A/dm$^2$ for 18 minutes. During this plating, the solution temperature was 22° C. After completion of the plating, the laminates were washed with water and then dried. The plating resistance of the various dry film resists is shown in Table 3. The compositions of the copper and solder plating solutions used were as follows.

| (Copper plating solution) | |
|---|---|
| Copper sulfate | 75 g/l |
| 98% sulfuric acid | 190 g/l |
| 36% hydrochloric acid | 0.12 ml/l |
| Brightener | 5 ml/l |
| (Solder plating solution) | |
| Tin | 15 g/l |
| Lead | 10 g/l |
| Free borofluoric acid | 400 g/l |
| Free boric acid | 21.6 g/l |
| Peptone | 5.2 g/l |

From the solder-plated laminates, the resist was stripped by spraying them with a 3% aqueous solution of sodium hydroxide at 45° C. The stripping was performed at a spray pressure of 1.0 kg/cm$^2$, using a spray nozzle held at a distance of 10 cm from the laminate. The time required to strip the resist from each laminate and the size of the stripped pieces were measured, and the results thus obtained are also shown in Table 3.

After the evaluation of strippability, the stripped pieces from each laminate were collected and placed in a beaker containing a 3% aqueous solution of sodium hydroxide. This beaker was sealed, allowed to stand in a constant temperature water bath at 45° C. for 24 hours, and then examined visually to determine whether the stripped pieces were dissolved or not. The results thus obtain. d are also shown in Table 3.

TABLE 1

| Binder resin | Composition of polymerizable monomer mixture (weight ratio) | |
|---|---|---|
| A | Methacrylic acid/styrene/methyl acrylate/methyl methacrylate | 20/10/25/45 |
| B | Methacrylic acid/styrene/methyl acrylate/methyl methacrylate | 13/10/30/47 |
| C | Methacrylic acid/styrene/methyl acrylate/methyl methacrylate | 20/5/45/30 |
| D | Methacrylic acid/styrene/methyl acrylate/methyl methacrylate | 20/15/8/57 |
| E | Methacrylic acid/styrene/methyl acrylate/methyl methacrylate | 20/30/15/35 |
| F | Methacrylic acid/styrene/n-butyl acrylate/methyl methacrylate | 25/15/20/40 |

TABLE 2

| Component | Example No. | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Binder resin solution A | 150 | | 120 | 165 | 150 | 150 | 150 | 150 | 150 | 150 | 150 | 150 | 150 | 150 |
| Binder resin solution B | | | | | | | | | | | | | | |
| Binder resin solution C | | | | | | | | | | | | | | |
| Binder resin solution D | | | | | | | | | | | | | | |
| Binder resin solution E | | | | | | | | | | | | | | |
| Binder resin solution F | | 150 | | | | | | | | | | | | |
| Heptapropylene glycol diacrylate (*1) | 25 | 25 | 35 | 22 | 35 | 25 | | | | 20 | 20 | 25 | 25 | 20 |
| Heptapropylene glycol dimethacrylate | | | | | | | 25 | | | | | | | |
| Hexa(1,3-butanediol) diacrylate | | | | | | | | 25 | | | | | | |
| Octa(2,2-dimethyl-1,3-propanediol) diacrylate | | | | | | | | | 25 | | | | | |
| Nonaethylene glycol diacrylate (*2) | | | | | | | | | | | | | | |
| Tripropylene glycol diacrylate (*3) | | | | | | | | | | | | | | |
| Tetrapropylene glycol diacrylate | | | | | | | | | | | | | | |
| Undecapropylene glycol diacrylate | | | | | | | | | | | | | | |
| Hexa(2-ethyl-1,3-hexanediol) diacrylate | | | | | | | | | | | | | | |

TABLE 2-continued

| Component | | | | | | | | | | | | | | |
|---|---|---|---|---|---|---|---|---|---|---|---|---|---|---|
| Propylene glycol diglycidyl ether diacrylate (*4) | | | | | | | | | | | 10 | | | 10 |
| Glycerol triglycidyl ether triacrylate (*5) | | | | | | | | | | 10 | | | | |
| Trimethylolpropane triacrylate | | | | | 10 | | | | 5 | | | | | |
| Tetraethylene glycol diacrylate | 10 | 10 | 12 | 8 | | 10 | 10 | 10 | 5 | | 10 | 10 | | |
| Benzophenone | 6 | 6 | 5.6 | 5.1 | 6 | 6 | 6 | 6 | 6 | 6 | 6 | 6 | 6 | 6 |
| Michler's ketone | 1 | 1 | 1 | 1 | 1 | 1 | 1 | 1 | 1 | 1 | 1 | 1 | 1 | 1 |
| 5-Phenyltetrazole | | | | | | | | | | | 0.3 | | | |
| 5-Aminotetrazole | | | | | | | | | | | | 0.3 | | 0.3 |
| Methylene blue | 0.2 | 0.2 | 0.2 | 0.2 | 0.2 | 0.2 | 0.2 | 0.2 | 0.2 | 0.2 | 0.2 | 0.2 | 0.2 | 0.2 |

| Component | Comparative Example No. | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Binder resin solution A | | | | | 100 | 185 | 185 | 150 | 150 | 150 | 150 | 150 | 150 | 150 | 150 | 150 |
| Binder resin solution B | 150 | | | | | | | | | | | | | | | |
| Binder resin solution C | | 150 | | | | | | | | | | | | | | |
| Binder resin solution D | | | 150 | | | | | | | | | | | | | |
| Binder resin solution E | | | | 150 | | | | | | | | | | | | |
| Binder resin solution F | | | | | | | | | | | | | | | | |
| Heptapropylene glycol diacrylate (*1) | 25 | 25 | 25 | 25 | 38 | 16 | 16 | | | | | | | 5 | | 10 |
| Heptapropylene glycol dimethacrylate | | | | | | | | | | | | | | | | |
| Hexa(1,3-butanediol) diacrylate | | | | | | | | | | | | | | | | |
| Octa(2,2-dimethyl-1,3-propanediol) diacrylate | | | | | | | | | | | | | | | | |
| Nonaethylene glycol diacrylate (*2) | | | | | | | | 25 | | | | | | | | |
| Tripropylene glycol diacrylate (*3) | | | | | | | | | 25 | | | | | | | |
| Tetrapropylene glycol diacrylate | | | | | | | | | | 25 | | | | | | |
| Undecapropylene glycol diacrylate | | | | | | | | | | | 25 | | | | | |
| Hexa(2-ethyl-1,3-hexanediol) diacrylate | | | | | | | | | | | | 25 | | | | |
| Propylene glycol diglycidyl ether diacrylate (*4) | | | | | | | | | | | | | | | 10 | 20 |
| Glycerol triglycidyl ether triacrylate (*5) | | | | | | | | | | | | | | | | |
| Trimethylolpropane triacrylate | | | | | | | | | | | | | 25 | | | |
| Tetraethylene glycol diacrylate | 10 | 10 | 10 | 10 | 16 | 6 | 6 | 10 | 10 | 10 | 10 | 10 | 10 | 30 | 5 | 5 |
| Benzophenone | 6 | 6 | 6 | 6 | 6.3 | 5.4 | 5.4 | 6 | 6 | 6 | 6 | 6 | 6 | 6 | 6 | 6 |
| Michler's ketone | 1 | 1 | 1 | 1 | 1 | 1 | 1 | 1 | 1 | 1 | 1 | 1 | 1 | 1 | 1 | 1 |
| 5-Phenyltetrazole | | | | | | | 1.0 | | | | | | | | | |
| 5-Aminotetrazole | | | | | | | | | | | | | | | | |
| Methylene blue | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 |

(Notes)
All binder resin solutions have a solid content of 38.7% by weight. Accordingly, 100, 120, 150, 165 and 185 parts by weight of a binder resin solution contain 38.7, 46.4, 58.0, 63.9 and 71.6 parts by weight of solid matter, respectively.
*1 Trade name: NK Ester APG-400 (manufactured by Shin-Nakamura Chemical Co., Ltd.).
*2 Trade name: NK Ester A-400 (manufactured by Shin-Nakamura Chemical Co., Ltd.).
*3 Trade name: NK Ester APG-200 (manufactured by Shin-Nakamura Chemical Co., Ltd.).
*4 Trade name: Denacol Acrylate DA-911 (manufactured by Nagase Chemical Industry Co., Ltd.).
*5 Trade name: Denacol Acrylate DA-314 (manufactured by Nagase Chemical Industry Co., Ltd.).

TABLE 3

| | Cold flow | Plating resistance (see note 1) | Stripping time (sec) | Size of stripped pieces (see note 2) | Solubility of stripped pieces (after 24 hours) | Remarks |
|---|---|---|---|---|---|---|
| Example | | | | | | |
| 1 | No | ◯ | 60 | Medium | Not dissolved | |
| 2 | No | ◯ | 60 | Medium | Not dissolved | |
| 3 | No | ◯ | 70 | Medium | Not dissolved | |
| 4 | No | ◯ | 55 | Medium | Not dissolved | |
| 5 | No | ◯ | 55 | Medium | Not dissolved | |
| 6 | No | ◯ | 60 | Medium | Not dissolved | |
| 7 | No | ◯ | 65 | Medium | Not dissolved | |
| 8 | No | ◯ | 60 | Medium | Not dissolved | |
| 9 | No | ◯ | 65 | Medium | Not dissolved | |
| 10 | No | ◉ | 45 | Medium | Not dissolved | |
| 11 | No | ◉ | 45 | Medium | Not dissolved | |

TABLE 3-continued

| | Cold flow | Plating resistance (see note 1) | Stripping time (sec) | Size of stripped pieces (see note 2) | Solubility of stripped pieces (after 24 hours) | Remarks |
|---|---|---|---|---|---|---|
| 12 | No | ◉ | 60 | Medium | Not dissolved | |
| 13 | No | ◉ | 60 | Medium | Not dissolved | |
| 14 | No | ◉ | 45 | Medium | Not dissolved | |
| Comparative Example | | | | | | |
| 1 | No | △ | 105 | Medium | Not dissolved | Very long developing time |
| 2 | Yes (all over the surface) | ○ | 60 | Medium | Not dissolved | |
| 3 | No | △ | 75 | Medium | Not dissolved | |
| 4 | No | ○ | 110 | Medium | Not dissolved | Long developing time |
| 5 | Yes (all over the surface) | ○ | 200 | Medium | Not dissolved | |
| 6 | No | X | 50 | Medium | Half dissolved | |
| 7 | No | △ | 55 | Medium | Half dissolved | |
| 8 | No | △~○ | 140 | Small | Dissolved | |
| 9 | No | ○ | 100 | Small | Not dissolved | |
| 10 | No | ○ | 90 | Small | Not dissolved | |
| 11 | No | △ | 80 | Large | Not dissolved | |
| 12 | No | △ | 80 | Medium | Not dissolved | |
| 13 | No | ○ | 130 | Small | Dissolved | |
| 14 | No | △ | 90 | Small | Dissolved | |
| 15 | No | ○ | 85 | Small | Not dissolved | |
| 16 | No | △~○ | 40 | Medium | Dissolved | |

(Note 1)
Plating resistance: ◉ = Very good. ○ = Good. △~ ○ = Slight under-plating. △ = Much under-plating. X~△ = Some metal bridges formed between patterns. X = Many metal bridges formed between patterns.
(Note 2)
Size of stripped pieces: Large = Larger than 45 mm × 45 mm. Medium = 3–40 mm × 3–40 mm. Small = Smaller than 2 mm × 2 mm.

What is claimed is:

1. A crosslinking-curable resin composition consisting essentially of
   (a) 40 to 70 parts by weight of a thermoplastic polymer binder obtained by copolymerizing
      (1) 15 to 35% by weight of a first polymerizable substance comprising one or more α,β-unsaturated carboxyl-containing monomers having 3 to 15 carbon atoms,
      (2) 2 to 25% by weight of a second polymerizable substance comprising one or more compounds selected from the group consisting of compounds of the general formula

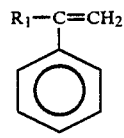

$$R_1-\underset{\underset{\text{(ring)}}{}}{C}=CH_2 \quad [I]$$

where $R_1$ is hydrogen, an alkyl group of 1 to 6 carbon atoms, or a halogen, and ring-substituted derivatives thereof,
      (3) 10 to 40% by weight of a third polymerizable substance comprising one or more compounds selected from the group consisting of alkyl acrylates having an alkyl group of 1 to 8 carbon atoms, and hydroxyalkyl acrylates having a hydroxyalkyl group of 2 to 8 carbon atoms, and
      (4) 30 to 65% by weight of a fourth polymerizable substance comprising one or more compounds selected from the group consisting of alkyl methacrylates having an alkyl group of 1 to 8 carbon atoms, and hydroxyalkyl methacrylates having a hydroxyalkyl group of 2 to 8 carbon atoms;
   (b) 25 to 50 parts by weight of a crosslinkable monomer having one or more ethylenically unsaturated groups in the molecule and containing 51 to 100% by weight of a compound of the general formula

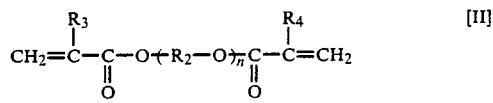

$$CH_2=\underset{\underset{O}{\|}}{\overset{R_3}{\underset{|}{C}}}-\underset{\underset{O}{\|}}{C}-O(R_2-O)_n\underset{\underset{O}{\|}}{C}-\overset{R_4}{\underset{|}{C}}=CH_2 \quad [II]$$

where $R_2$ is an alkylene group of 3 to 6 carbon atoms, $R_3$ and $R_4$ are hydrogen or methyl, and n is a positive whole number of 5 to 9; and
   (c) 0 to 10 parts by weight of a photopolymerization initiator;
the combined amount of components (a) to (c) being 100 parts by weight.

2. A crosslinking-curable resin composition as claimed in claim 1 wherein the crosslinkable monomer (b) having one or more ethylenically unsaturated groups in the molecule contains 51 to 95% by weight of at least one compound of the general formula

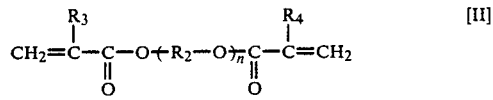

$$CH_2=\underset{\underset{O}{\|}}{\overset{R_3}{\underset{|}{C}}}-C-O(R_2-O)_n\underset{\underset{O}{\|}}{C}-\overset{R_4}{\underset{|}{C}}=CH_2 \quad [II]$$

where $R_2$ is an alkylene group of 3 to 6 carbon atoms, $R_3$ and $R_4$ are hydrogen or methyl, and n is a positive whole number of 5 to 9, and 5 to 49% by weight of at least one compound selected from the group consisting of compounds of the general formula

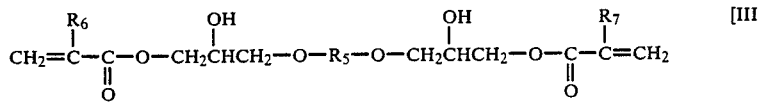

where $R_5$ is an organic radical having 2 to 33 carbon atoms, and $R_6$ and $R_7$ are hydrogen or methyl, and compounds of the general formula

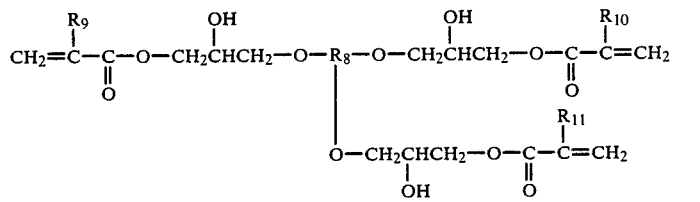

where $R_8$ is an organic radical having 3 to 15 carbon atoms, and $R_9$, $R_{10}$ and $R_{11}$ are hydrogen or methyl.

3. A crosslinking-curable resin composition as claimed in claim 1 wherein the compound of the general formula (II) is a compound of the general formula

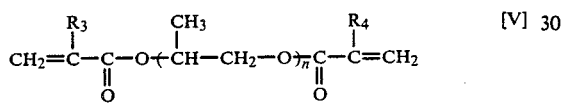

where $R_3$ and $R_4$ are hydrogen or methyl, and n is a positive whole number of 5 to 9.

4. A crosslinking-curable resin composition as claimed in claim 3 wherein the compound of the general formula (II) is a compound of the general formula (V) in which n is equal to 7.

5. A crosslinking-curable resin composition as claimed in claim 1 which additionally contains tetrazole or a derivative thereof in an amount of 0.005 to 5 parts by weight per 100 parts by weight of the combination of components (a), (b) and (c).

6. A crosslinking-curable resin composition as claimed in claim 1 wherein the first polymerizable substance used to obtain the thermoplastic polymer binder (a) comprises one or more compounds selected from the group consisting of acrylic acid, methacrylic acid, cinnamic acid, crotonic acid, sorbic acid, itaconic acid, propiolic acid, maleic acid and fumaric acid, as well as half esters and anhdyrides thereof.

7. A crosslinking-curable resin composition as claimed in claim 1 wherein the second polymerizable substance used to obtain the thermoplastic polymer binder (a) comprises one or more compounds selected from the group consisting of compounds of the general formula

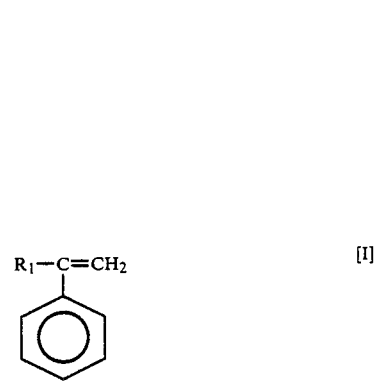

where $R_1$ is hydrogen, an alkyl group of 1 to 6 carbon atoms, or a halogen, and ring-substituted derivatives thereof in which the benzene ring is substituted by one or more functional groups such as nitro, alkoxy, acyl, carboxyl, sulfone, hydroxyl groups and halogen radicals, and the number of substituent groups present on the benzene ring is in the range of 1 to 5.

8. A crosslinking-curable resin composition as claimed in claim 1 wherein the third polymerizable substance used to obtain the thermoplastic polymer binder (a) comprises one or more compounds selected from the group consisting of methyl acrylate, ethyl acrylate, n-propyl acrylate, isopropyl acrylate, n-butyl acrylate, sec-butyl acrylate, tert-butyl acrylate, 2-hydroxyethyl acrylate, 2-hydroxypropyl acrylate and 2-ethylhexyl acrylate.

9. A crosslinking-curable resin composition as claimed in claim 1 wherein the fourth polymerizable substance used to obtain the thermoplastic polymer binder (a) comprises one or more compounds selected from the group consisting of methyl methacrylate, ethyl methacrylate, n-propyl methacrylate, isopropyl methacrylate., n-butyl methacrylate, sec-butyl methacrylate, tertbutyl methacrylate, 2-hydroxyethyl methacrylate, 2-hydroxypropyl methacrylate and 2-ethylhexyl methacrylate.

10. A crosslinking-curable resin composition as claimed in claim 1 wherein the weight average molecular weight of the thermoplastic polymer binder (a) is in the range of 40,000 to 500,000.

* * * * *